United States Patent
Ichiyama et al.

(10) Patent No.: US 7,917,331 B2
(45) Date of Patent: Mar. 29, 2011

(54) DETERMINISTIC COMPONENT IDENTIFYING APPARATUS, IDENTIFYING, PROGRAM, RECORDING MEDIUM, TEST SYSTEM AND ELECTRONIC DEVICE

(75) Inventors: Kiyotaka Ichiyama, Saitama (JP); Masahiro Ishida, Miyagi (JP); Takahiro Yamaguchi, Miyagi (JP)

(73) Assignee: Advantest Corporation, Tokyo (JP)

( * ) Notice: Subject to any disclaimer, the term of this patent is extended or adjusted under 35 U.S.C. 154(b) by 116 days.

(21) Appl. No.: 12/272,810

(22) Filed: Nov. 18, 2008

(65) Prior Publication Data
US 2010/0106470 A1 Apr. 29, 2010

Related U.S. Application Data

(60) Provisional application No. 61/107,674, filed on Oct. 23, 2008.

(51) Int. Cl.
*G06F 17/17* (2006.01)
*G06F 17/00* (2006.01)

(52) U.S. Cl. ............ 702/179; 702/75; 702/76; 708/309; 708/311

(58) Field of Classification Search .................. 702/179, 702/75, 76
See application file for complete search history.

(56) References Cited

U.S. PATENT DOCUMENTS

| 7,127,018 | B2 * | 10/2006 | Yamaguchi et al. | 375/371 |
| 2005/0129104 | A1 * | 6/2005 | Ishida et al. | 375/224 |
| 2008/0077357 | A1 * | 3/2008 | Yamaguchi et al. | 702/181 |
| 2008/0098055 | A1 * | 4/2008 | Yamaguchi et al. | 708/200 |
| 2008/0189064 | A1 * | 8/2008 | Yamaguchi et al. | 702/69 |

FOREIGN PATENT DOCUMENTS

JP 2007-108492 9/2007

* cited by examiner

*Primary Examiner* — Hal D Wachsman
(74) *Attorney, Agent, or Firm* — Osha Liang LLP

(57) ABSTRACT

A deterministic component identifying apparatus identifies a distribution shape of a deterministic component included in a probability density function supplied thereto. The apparatus includes a standard deviation calculating section that calculates a standard deviation of the probability density function, a spectrum calculating section that calculates a spectrum of the probability density function, a null frequency detecting section that detects a null frequency of the spectrum, and a ratio calculating section that calculates a ratio between a top portion and a bottom portion of a distribution of the deterministic component, based on the standard deviation of the probability density function and the null frequency of the spectrum.

14 Claims, 19 Drawing Sheets

| TYPE OF DETERMINISTIC COMPONENT | PROBABILITY DENSITY FUNCTION OF THE DETERMINISTIC COMPONENT | | NULL FREQUENCY $f_{zero}$ | $\dfrac{DJ_{rms}}{DJ_{p-p}}$ |
|---|---|---|---|---|
| | TIME DOMAIN $d(t)$ | FREQUENCY DOMAIN $D(f)$ | | |
| SINUSOIDAL DISTRIBUTION | $\dfrac{2}{\pi\sqrt{DJ_{p-p}^2 - 4t^2}}$ | $I_0(\pi \cdot DJ_{p-p} \cdot f)$ | $\dfrac{0.765}{DJ_{p-p}}$ | $\dfrac{1}{2\sqrt{2}}$ |
| TRAPEZOIDAL DISTRIBUTION | $\dfrac{\cdot \alpha \cdot DJ_{p-p}/2 < \|t\| < DJ_{p-p}/2}{\dfrac{2DJ_{p-p} - 4\|t\|}{DJ_{p-p}^2(1-\alpha^2)}}$ $\dfrac{\cdot \alpha \cdot DJ_{p-p}/2 \geq \|t\|}{\dfrac{2}{DJ_{p-p}(1+\alpha)}}$ | $\mathrm{sinc}\left(\dfrac{(1+\alpha)}{2} \cdot DJ_{p-p} \cdot f\right) \cdot \mathrm{sinc}\left(\dfrac{(1-\alpha)}{2} \cdot DJ_{p-p} \cdot f\right)$ | $\dfrac{2}{(1+\alpha) \cdot DJ_{p-p}}$ | $\sqrt{\dfrac{1+\alpha^2}{24}}$ |
| DUAL DIRAC DISTRIBUTION | $\dfrac{\delta\left(t + \dfrac{DJ_{p-p}}{2}\right) + \delta\left(t - \dfrac{DJ_{p-p}}{2}\right)}{2}$ | $\cos(\pi \cdot DJ_{p-p} \cdot f)$ | $\dfrac{1}{2 \cdot DJ_{p-p}}$ | $\dfrac{1}{2}$ |
| DIRAC DISTRIBUTION | $\delta(t)$ | Constant, 1 | No null frequency | undefined ($DJ_{rms}=0$, $DJ_{p-p}=0$) |

FIG. 7

DETERMINISTIC COMPONENT IDENTIFYING APPARATUS, IDENTIFYING, PROGRAM, RECORDING MEDIUM, TEST SYSTEM AND ELECTRONIC DEVICE

CROSS REFERENCE TO RELATED APPLICATIONS

The present application claims priority from a provisional application No. 61/107,674 filed on Oct. 23, 2008, the contents of which are incorporated herein by reference.

BACKGROUND

1. Technical Background

The present invention relates to a deterministic component identifying apparatus, a determining method, a program, a recording medium, a test system, and an electronic device.

2. Related Art

Electronic circuits, communication systems, and the like are conventionally tested by measuring characteristic values of an electric signal. For example, serial transmission evaluation involves evaluating a communication system by measuring jitter in a transmission signal or a reception signal.

The characteristic value of the jitter includes (i) a deterministic component caused deterministically by characteristics such as the signal pattern and the transmission path and (ii) a random component occurring randomly. In a more thorough evaluation, it is desirable to evaluate the deterministic component and the random component separately.

When measuring the deterministic component and the random component, a characteristic value is measured several times to obtain a probability density function. The probability density function can be thought of as a convolution of the deterministic component and the random component, and therefore the deterministic component and the random component can be separated by deconvoluting the deterministic component from the probability density function, as shown in, for example, International Publication Pamphlet No. 2007/108492.

The invention disclosed in the above pamphlet calculates the deterministic component based on a first null frequency in the spectrum of the probability density function. At this time, the model of the deterministic component included in the probability density function is already known. But since there are several types of models for the deterministic component, the deterministic component cannot be calculated accurately unless an accurate model is determined for the deterministic component in the probability density function. If the deterministic component follows a trapezoidal distribution, the shape of the distribution changes according to the trapezoid ratio, and it is therefore desirable that the trapezoid ratio be accurately measured.

SUMMARY

Therefore, it is an object of an aspect of the innovations herein to provide a deterministic component identifying apparatus, a determining method, a program, a storage medium, a test system, and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary deterministic component identifying apparatus may include a deterministic component identifying apparatus that identifies a distribution shape of a deterministic component included in a probability density function supplied thereto, comprising: a standard deviation calculating section that calculates a standard deviation of the probability density function; a spectrum calculating section that calculates a spectrum of the probability density function; a null frequency detecting section that detects a null frequency of the spectrum; and a ratio calculating section that calculates a ratio between a top portion and a bottom portion of a distribution of the deterministic component, based on the standard deviation of the probability density function and the null frequency of the spectrum.

According to a second aspect related to the innovations herein, one exemplary deterministic component identifying method may include a method for identifying a distribution shape of a deterministic component included in a supplied probability density function, comprising: calculating a standard deviation of the probability density function; calculating a spectrum of the probability density function; detecting a null frequency of the spectrum; and calculating a ratio between a top portion and a bottom portion of a distribution of the deterministic component, based on the standard deviation of the probability density function and the null frequency of the spectrum.

According to a third aspect related to the innovations herein, one exemplary storage medium and program may include a storage medium storing thereon a program causing a computer to function as a deterministic component identifying apparatus that identifies a distribution shape of a deterministic component included in a probability density function supplied thereto, the computer being caused to function as: a standard deviation calculating section that calculates a standard deviation of the probability density function; a spectrum calculating section that calculates a spectrum of the probability density function; a null frequency detecting section that detects a null frequency of the spectrum; and a ratio calculating section that calculates a ratio between a top portion and a bottom portion of a distribution of the deterministic component, based on the standard deviation of the probability density function and the null frequency of the spectrum.

According to a fourth aspect related to the innovations herein, one exemplary test system may include a test system that tests a device under test, comprising: a measuring section that measures a prescribed characteristic of the device under test a plurality of times; a deterministic component identifying apparatus that identifies a distribution shape of a deterministic component included in a probability density function of characteristic values measured by the measuring section, and calculates the deterministic component; and an acceptability judging section that judges acceptability of the device under test based on the deterministic component calculated by the deterministic component identifying apparatus. The deterministic component identifying apparatus includes: a standard deviation calculating section that calculates a standard deviation of the probability density function; a spectrum calculating section that calculates a spectrum of the probability density function; a null frequency detecting section that detects a null frequency of the spectrum; and a ratio calculating section that calculates a ratio between a top portion and a bottom portion of a distribution of the deterministic component, based on the standard deviation of the probability density function and the null frequency of the spectrum.

According to a fifth aspect related to the innovations herein, one exemplary electronic device may include an electronic device that generates a prescribed signal, comprising: an operation circuit that generates and outputs the prescribed signal; a measuring section that measures a prescribed characteristic of the prescribed signal a plurality of times; and a deterministic component identifying apparatus that identifies a distribution shape of a deterministic component included in a probability density function of characteristic values measured by the measuring section, and calculates the deterministic component. The deterministic component identifying apparatus includes: a standard deviation calculating section that calculates a standard deviation of the probability density function; a spectrum calculating section that calculates a spectrum of the probability density function; a null frequency detecting section that detects a null frequency of the spectrum; and a ratio calculating section that calculates a ratio between a top portion and a bottom portion of a distribution of the deterministic component, based on the standard deviation of the probability density function and the null frequency of the spectrum.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 7 shows a chart showing a time domain model, a frequency domain model, a relation between the first null frequency $f_{zero}$ and the peak-to-peak value $DJ_{P-P}$, and the relationship between the peak-to-peak value $DJ_{P-P}$ and a root mean squared value $DJ_{RMS}$, for each type of deterministic component.

FIG. 9A shows a spectrum g(f) of a probability density function. FIG. 9B shows a first-order differentiated waveform g'(f). FIG. 9C shows a second-order differentiated waveform g''(f). FIG. 9D shows a third-order differentiated waveform g'''(f).

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
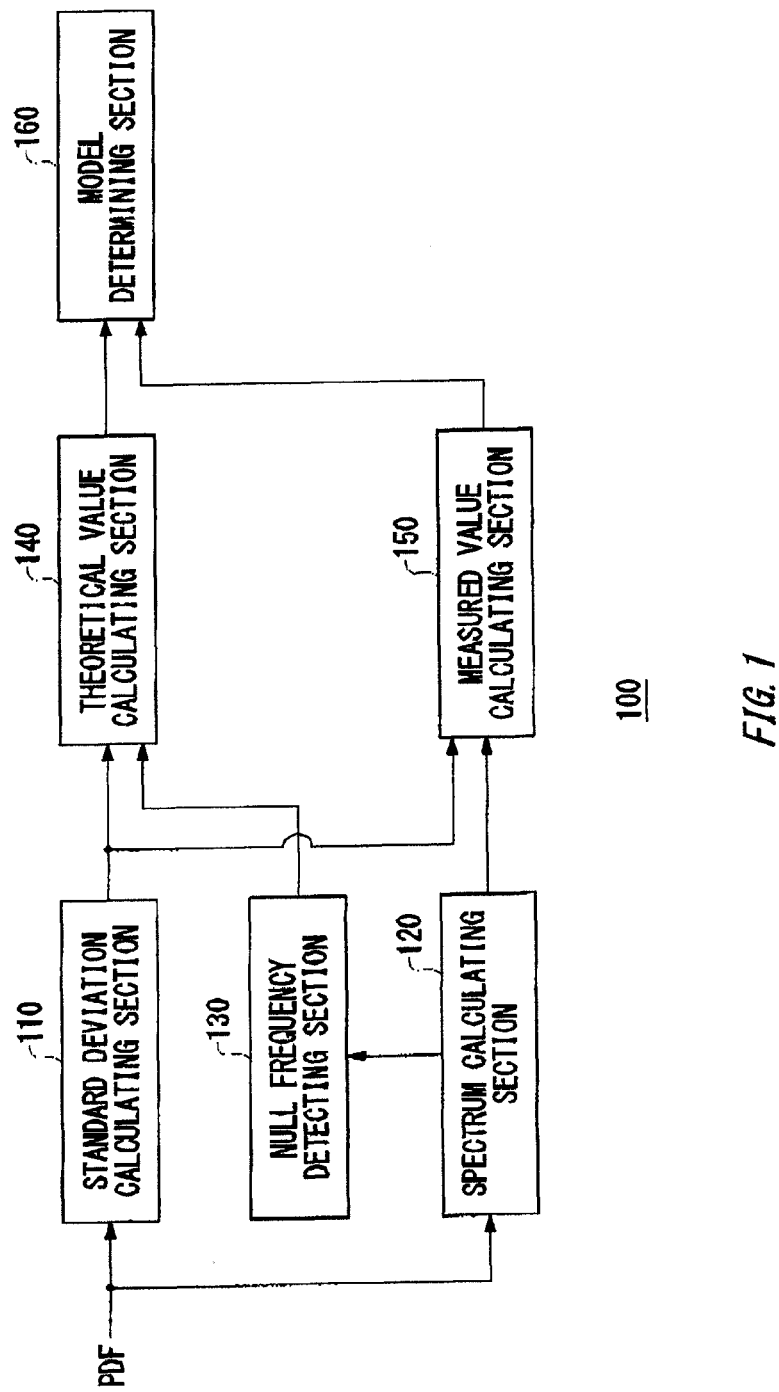
FIG. 1 shows an exemplary functional configuration of a deterministic component identifying apparatus 100 according to an embodiment of the present invention.

FIG. 1 shows an exemplary functional configuration of a deterministic component identifying apparatus 100 according to an embodiment of the present invention. The deterministic component identifying apparatus 100 determines the distribution shape of a deterministic component included in a probability density function supplied thereto. In particular, the deterministic component identifying apparatus 100 determines the type or model of the deterministic component. The deterministic component identifying apparatus 100 includes a standard deviation calculating section 110, a spectrum calculating section 120, a null frequency detecting section 130, a theoretical value calculating section 140, a measured value calculating section 150, and a model determining section 160.

First, a probability density function, a deterministic component, and a random component will be described. If the deterministic component and the random component, which are included in the probability density function, are independent from each other, the probability density function on the time axis can be calculated as a convolution of the deterministic component and the random component on the time axis. Therefore, the spectrum H(f) of the probability density function can be calculated as a product of the deterministic component spectrum D(f) and the random component spectrum R(f), as shown below.

$$H(f)=D(f) \cdot R(f)$$

The random component usually follows a Gaussian distribution, and therefore the spectrum R(f) can be found using the expression below.

$$R(f)=\exp(-2\pi^2 \sigma_{RJ,RMS}^2 f^2)$$

Here, $\sigma_{RJ,RMS}$ represents the standard deviation of the random component. Therefore, the random component can be determined if the standard deviation of the random component can be measured. The deterministic component can then be determined by subtracting the random component from the provided probability density function.

The provided probability density function, however, includes the deterministic component and the random component, and therefore it is difficult to measure the standard deviation of only the random component from the probability density function. But if the deterministic component and the random component are independent from each other, the standard deviation $\sigma_{TJ,RMS}$ of the probability density function can be calculated from the standard deviation $\sigma_{RJ,RMS}$ of the random component and the standard deviation $DJ_{RMS}$ of the deterministic component, as shown by the expression below.

$$\sigma_{TJ,RMS}{}^2 = \sigma_{RJ,RMS}{}^2 + DJ_{RMS}{}^2$$

Accordingly, the spectrum of the probability density function can be calculated by Expression 1 below $$H(f) = D(f) \cdot \exp(-2\pi^2 \sigma_{TJ,RMS}{}^{2f2}) \cdot \exp(-2\pi^2 DJ_{RMS}{}^{2f2}) \quad \text{Expression 1}$$

The standard deviation $DJ_{RMS}$ of the deterministic component can be calculated from the peak-to-peak value $DJ_{P-P}$ of the deterministic component. In other words, Expression 1 can be used to separate the deterministic component $D(f)$ from the probability density function $H(f)$ if the standard deviation $\sigma_{TJ,RMS}$ of the probability density function and the peak-to-peak value $DJ_{P-P}$ of the deterministic component can be measured.

The standard deviation calculating section 110 calculates the standard deviation $\sigma_{RJ,RMS}$ of the provided probability density function. The standard deviation calculating section 110 may calculate the standard deviation $\sigma_{TJ,RMS}$ of the probability density function on the time axis using Expression 2.

$$\sigma_{TJ,RMS} = \sqrt{\sum_{k=1}^{N} p_k(x_k - \mu)^2} \quad \text{Expression 2}$$

Here, $x_i$ is the central value of the i-th bin of the provided probability density function, $y_i$ is the number of events of the i-th bin, and N is the total number of bins. Furthermore, $p_i$ and $\mu$ are provided below.

$$p_i = \frac{y_i}{\sum_{k=1}^{N} y_k}, \mu = \sum_{k=1}^{N} p_k x_k$$

The spectrum calculating section 120 outputs a spectrum of the provided probability density function. The standard deviation calculating section 110 and the spectrum calculating section 120 may be provided, in parallel, with the probability density function on the time axis.

The null frequency detecting section 130 detects a null frequency of the spectrum calculated by the spectrum calculating section 120. The null frequency is a frequency at which the power of the spectrum is substantially zero or a very small value. As described below, the peak-to-peak value $DJ_{P-P}$ of the deterministic component can be calculated from the null frequency of the spectrum of the probability density function.

Figure 2:
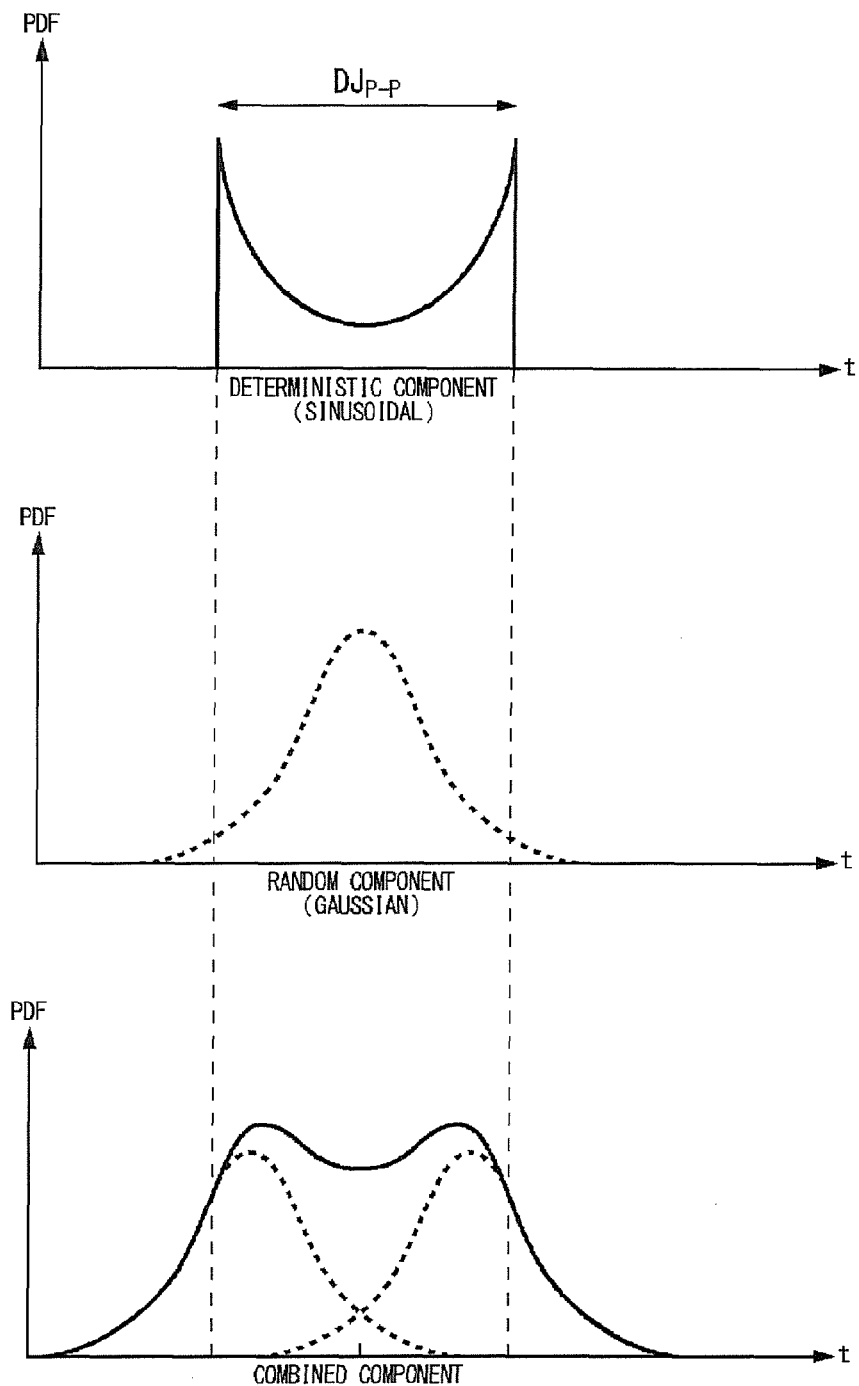
FIG. 2 shows an exemplary probability density function provided to the deterministic component identifying apparatus 100.

FIG. 2 shows an exemplary probability density function provided to the deterministic component identifying apparatus 100. The probability density function may show a distribution of measured values obtained by measuring a prescribed characteristic of an electronic circuit several times. The prescribed characteristic may be a jitter amount, an amplitude value, or a DC value of a signal output by an electronic circuit or an optical circuit, for example.

For example, the jitter amount may show the phase noise of the signal. More specifically, the jitter amount may indicate a difference between the edge timing of the signal and an ideal edge timing. In this case, the probability density function may represent the measured value distribution, i.e. the occurrence rate, when the jitter value of each edge of the signal is measured. The amplitude value may represent the amplitude of voltage, current, optical intensity, or the like of the signal. The DC current value may represent the DC level of voltage, current, optical intensity, or the like of the signal.

Generally, the probability density function of such characteristics includes a deterministic component and a random component. For example, the probability density function of the jitter amount includes a random component that occurs randomly and a deterministic component that occurs periodically due to the characteristics or the like of the transmission line.

The random component of the probability density function follows a Gaussian distribution, as shown in FIG. 2. The deterministic component follows a variety of different models depending on what causes the deterministic component. In FIG. 2, for example, the model of the deterministic component is a sinusoidal distribution, but may instead be a uniform distribution, a trapezoidal distribution, a dual Dirac distribution, a single Dirac distribution, or the like.

Figure 3A:
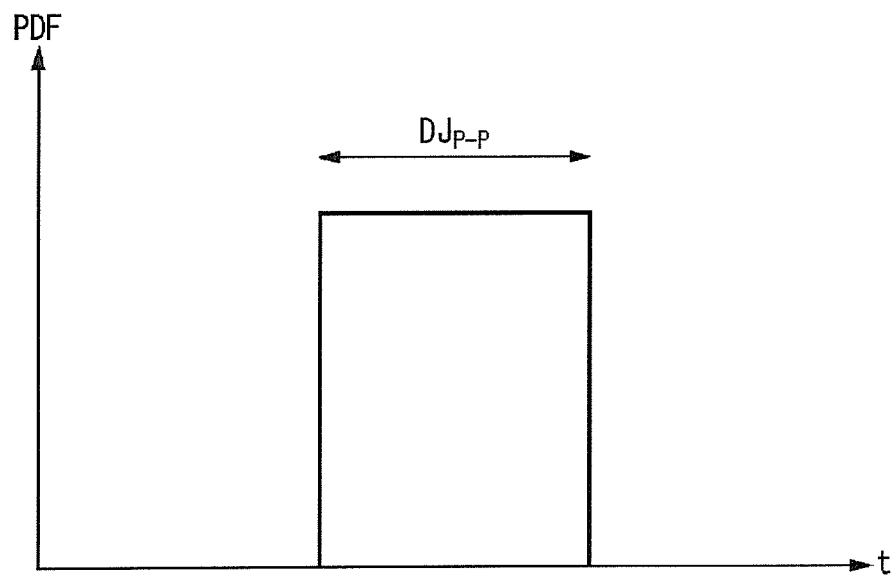
FIG. 3A shows a probability density function of a deterministic component following a uniform distribution.
Figure 3B:
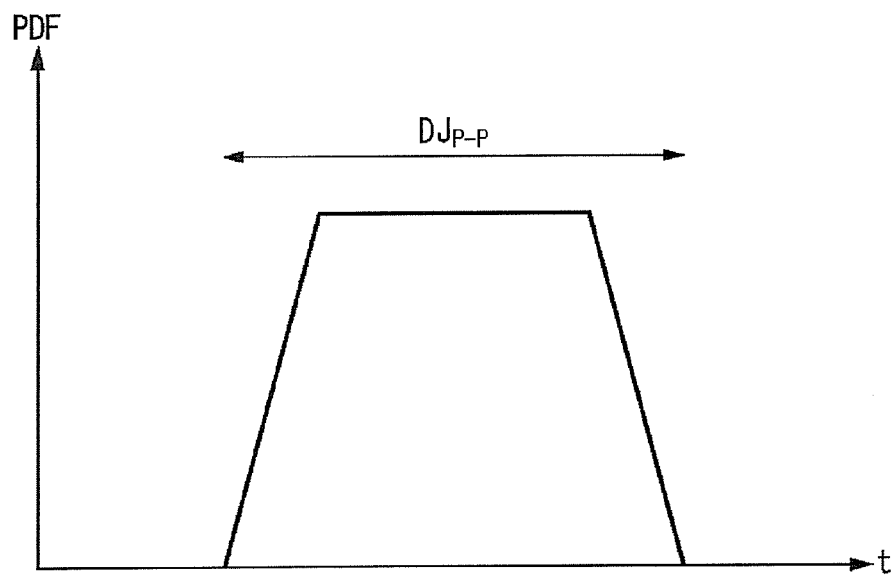
FIG. 3B shows a probability density function of a deterministic component following a trapezoidal distribution.
Figure 4A:
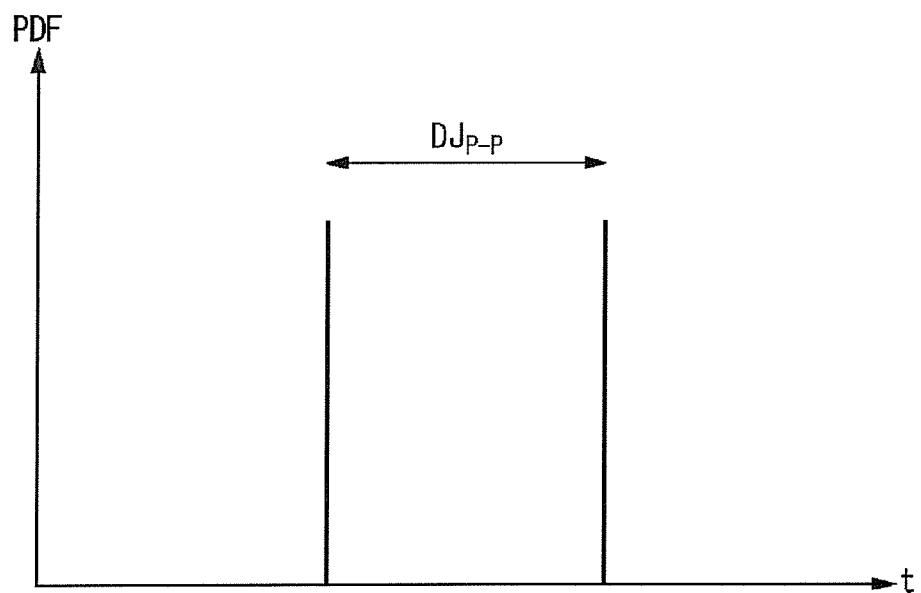
FIG. 4A shows a probability density function of a deterministic component following a dual Dirac distribution.
Figure 4B:
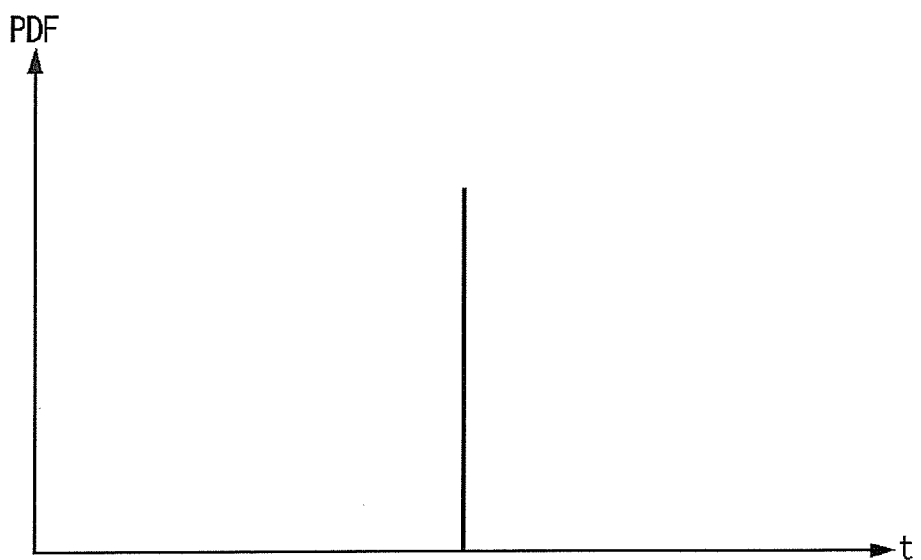
FIG. 4B shows a probability density function of a deterministic component following a single Dirac distribution.

FIGS. 3A, 3B, 4A, and 4B show probability density function having deterministic components following various models. FIG. 3A shows a deterministic component following a uniform distribution. FIG. 3B shows a deterministic component following a trapezoidal distribution. FIG. 4A shows a deterministic component following a dual Dirac distribution. FIG. 4B shows a deterministic component following a single Dirac distribution.

As shown in FIGS. 2 to 4B, the distribution of the deterministic component can usually be determined for a certainty if the peak-to-peak value $DJ_{P-P}$ is determined in the corresponding model. However, it is desirable that a ratio between a top portion and a bottom portion be further provided for the deterministic component following the trapezoidal distribution. Furthermore, the deterministic component following the single Dirac distribution is provided as a deterministic component with a peak-to-peak value of substantially zero.

The deterministic component identifying apparatus 100 of the present embodiment calculates the peak-to-peak value $DJ_{P-P}$ of the deterministic component based on the null frequency of the spectrum of the probability density function. The following describes an example in which the smallest frequency among the null frequencies of the spectrum is used as a first null frequency.

Figure 5B:
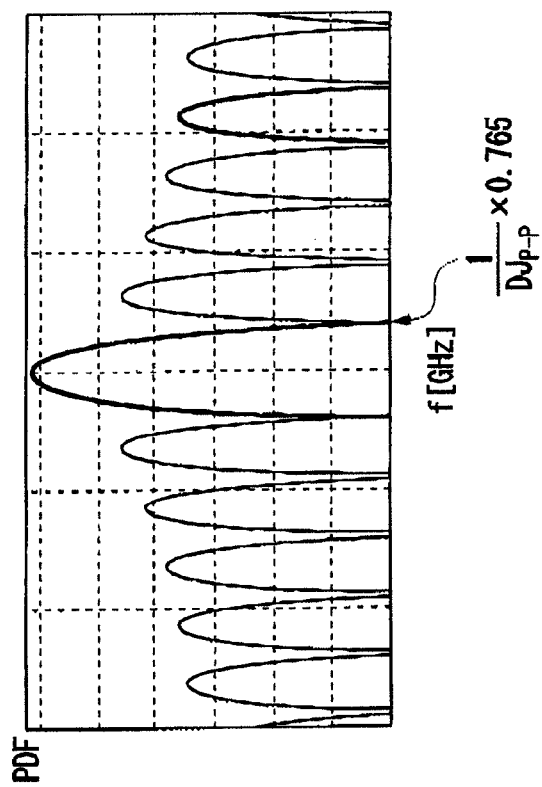
FIG. 5B shows the spectrum of a deterministic component following a sinusoidal distribution model.
Figure 5A:
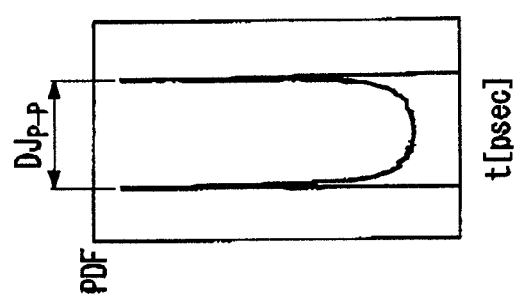
FIG. 5A shows the probability density function of a deterministic component following a sinusoidal distribution model.
Figure 5D:
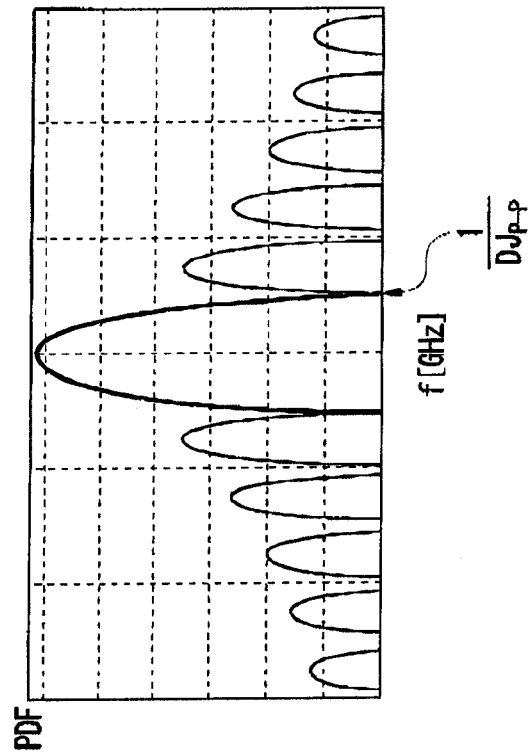
FIG. 5D shows the spectrum of a deterministic component following a uniform distribution model.
Figure 5C:
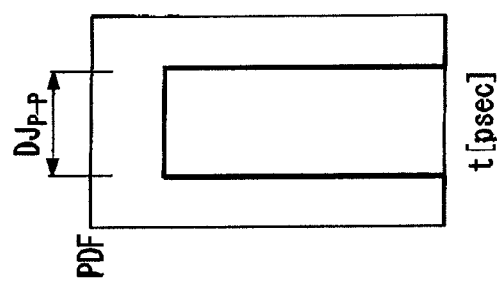
FIG. 5C shows the probability density function of a deterministic component following a uniform distribution model.

FIGS. 5A-5D show the probability density function and the spectrum of deterministic components following prescribed models. FIGS. 5A and 5B respectively show the probability density function and the spectrum of a deterministic component following a sinusoidal distribution model. FIGS. 5C and 5D respectively show the probability density function and the spectrum of a deterministic component following a uniform distribution model. In FIGS. 5A and 5C, the waveform represents the probability density function in the time domain, and, in FIGS. 5B and 5D, the waveform represents the spectrum of the probability density function. Furthermore, $DJ_{P-P}$ represents the peak-to-peak value of the deterministic component in the time domain.

As shown in FIGS. 5A and 5B, the first null frequency of the spectrum obtained by Fourier transforming the probability density function of the deterministic component following the sinusoidal distribution is calculated as $0.765/DJ_{P\text{-}P}$. In other words, the peak-to-peak value $DJ_{P\text{-}P}$ of the deterministic component can be calculated by multiplying the inverse of the first null frequency by the coefficient 0.765. It should be noted that this coefficient is an approximate value, and more or less accurate values may be used instead, such as coefficients accurate to more or fewer decimals.

As shown in FIGS. 5C and 5D, the first null frequency of the spectrum obtained by Fourier transforming the probability density function of the deterministic component following the uniform distribution is calculated as $1/DJ_{P\text{-}P}$. In other words, the peak-to-peak value $DJ_{P\text{-}P}$ of the deterministic component can be calculated as the inverse of the first null frequency.

The peak-to-peak values of the deterministic components following other distributions, e.g. the trapezoidal distribution and the single Dirac distribution, can be calculated from the first null frequency in the same way. However, it is necessary to determine the model in order to accurately calculate the deterministic component, since the relationship between the first null frequency and the peak-to-peak value $DJ_{P\text{-}P}$ is different depending on the deterministic component model, as shown in FIGS. 5A-5D.

Figure 6:
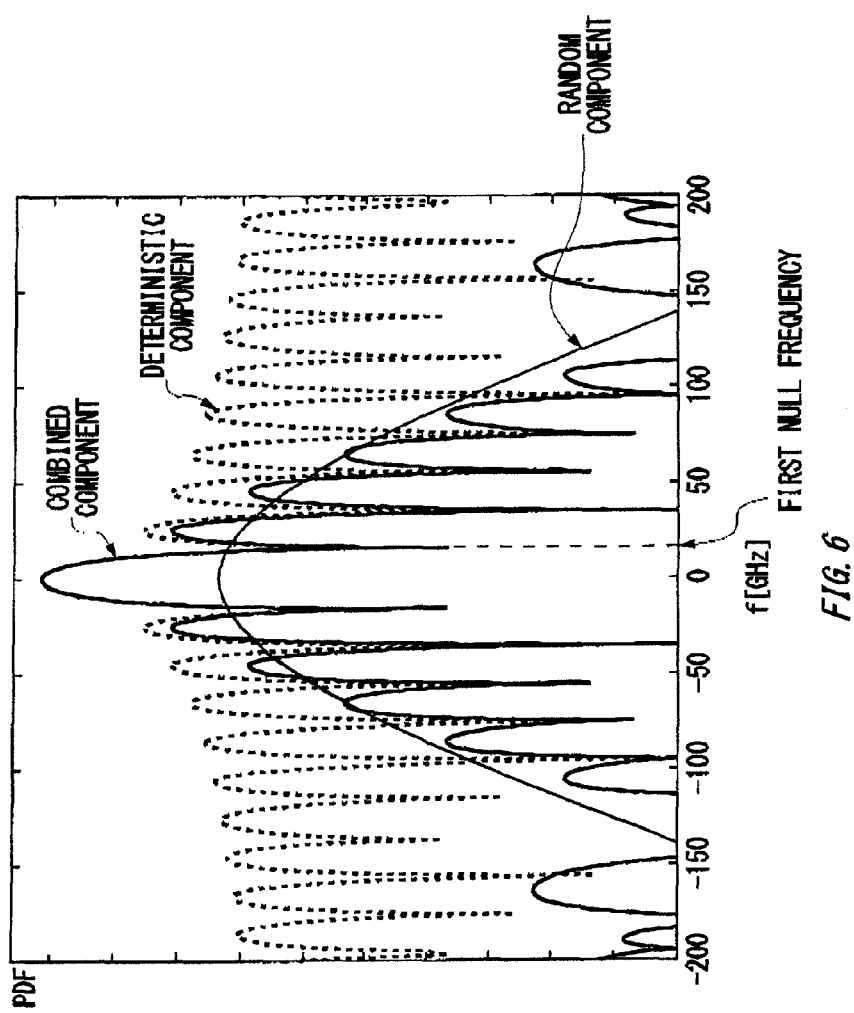
FIG. 6 shows an exemplary spectrum calculated by the spectrum calculating section 120.

FIG. 6 shows an exemplary spectrum calculated by the spectrum calculating section 120. The spectrum calculating section 120 calculates the spectrum of the provided probability density function. The spectrum calculating section 120 may calculate the spectrum by Fourier transforming the provided probability density function. The spectrum calculated by the spectrum calculating section 120 includes a spectrum of the deterministic component and a spectrum of the random component, as shown in FIG. 6.

The null frequency detecting section 130 detects the null frequency of the spectrum calculated by the spectrum calculating section 120. The null frequency detecting section 130 of the present embodiment detects the first null frequency, which is the smallest frequency from among the null frequencies of the spectrum.

In the manner described above, the first null frequency of the spectrum of the deterministic component corresponds to the peak-to-peak value of the deterministic component on the time axis. As shown in FIG. 6, the first null frequency of the combined spectrum of the deterministic component and the random component is almost identical to the first null frequency of the spectrum of the deterministic component.

Therefore, the first null frequency of the spectrum of the deterministic component can be detected by detecting the first null frequency of the spectrum of the provided probability density function. As described above, the peak-to-peak value $DJ_{P\text{-}P}$ of the deterministic component can be calculated from the first null frequency of the spectrum of the deterministic component. It should be noted that the calculated peak-to-peak value $DJ_{P\text{-}P}$ is different for each type of deterministic component.

FIG. 7 is a chart showing a time domain model, a frequency domain model, a relation between the first null frequency $f_{zero}$ and the peak-to-peak value $DJ_{P\text{-}P}$, and the relationship between the peak-to-peak value $DJ_{P\text{-}P}$ and a root mean squared value $DJ_{RMS}$, for each type of deterministic component. In FIG. 7, $I_0$ represents a Bessel function of the first kind with an order of 0.

In FIG. 7, $\alpha$ represents the ratio of the top portion to the bottom portion in the trapezoidal distribution. In other words, $\alpha=1$ corresponds to a uniform distribution, and $\alpha=0$ corresponds to a triangular distribution. The types of deterministic components that can be handled by the deterministic component identifying apparatus 100 are not limited to the types described above. The deterministic component identifying apparatus 100 may determine models for any deterministic component whose peak-to-peak value can be calculated from the first null frequency of the spectrum.

Here, the model for each type of deterministic component spectrum is expressed by the first null frequency $f_{zero}$ and the standard deviation $\sigma_{TJ,RMS}$ that can be calculated from the provided probability density function. The model for the spectrum of a deterministic component following a sinusoidal distribution is obtained from Expression 1 and FIG. 7, and is shown below in Expression 3.

$$H_{sin}(f) = I_0\left(0.765\pi \cdot \frac{f}{f_{zero}}\right) \cdot \exp\left(\frac{0.765^2 \pi^2}{4} \cdot \frac{f^2}{f_{zero}^2}\right) \cdot \exp(-2\pi^2 f^2 \sigma_{TJ,RMS}^2) \quad \text{Expression 3}$$

The model for the spectrum of a deterministic component following a trapezoidal distribution is provided in Expression 4.

$$H_{Tra}(f, \alpha) = \operatorname{sinc}\left(\frac{f}{f_{zero}}\right) \cdot \operatorname{sinc}\left(\frac{1-\alpha}{1+\alpha} \cdot \frac{f}{f_{zero}}\right) \cdot \exp\left(\frac{\pi^2(1+\alpha^2)}{3(1+\alpha)^2} \cdot \frac{f^2}{f_{zero}^2}\right) \cdot \exp(-2\pi^2 f^2 \sigma_{TJ,RMS}^2) \quad \text{Expression 4}$$

The model for the spectrum of a deterministic component following a dual Dirac distribution is provided in Expression 5.

$$H_{DD}(f) = \cos\left(\frac{\pi}{2} \cdot \frac{f}{f_{zero}}\right) \cdot \exp\left(\frac{\pi^2}{8} \cdot \frac{f^2}{f_{zero}^2}\right) \cdot \exp(-2\pi^2 f^2 \sigma_{TJ,RMS}^2) \quad \text{Expression 5}$$

The model for the spectrum of a deterministic component following a single Dirac distribution is provided in Expression 6.

$$H_{Dirac}(f) = \exp(-2\pi^2 f^2 \sigma_{TJ,RMS}^2) \quad \text{Expression 6}$$

The theoretical value calculating section 140 calculates theoretical values of the spectrum of each of a plurality of types of predetermined deterministic components, based on the standard deviation $\sigma_{TJ,RMS}$ calculated by the standard deviation calculating section 110 and the first null frequency $f_{zero}$ detected by the null frequency detecting section 130. For example, the theoretical value calculating section 140 calculates the theoretical values of each type of deterministic component based on Expressions 3 to 6. The theoretical value calculating section 140 may be provided in advance with Expressions 3 to 6.

The theoretical value calculating section 140 may instead calculate the theoretical values of the spectrums normalized by a Gaussian distribution spectrum having the standard deviation $\sigma_{TJ,RMS}$ calculated by the standard deviation calculating section 110. For example, the theoretical value calculating section 140 may calculate Y(x) in Expressions 3 to 6 using Expression 7.

$$Y(x) = H(x)/\exp(-2\pi^2 f^2 \sigma_{TJ,RMS}^2) \quad \text{Expression 7}$$

The theoretical value calculating section 140 may instead calculate the theoretical values of the spectrums having a frequency f normalized with the first null frequency $f_{zero}$. For example, the theoretical value calculating section 140 may calculate the theoretical values in Expressions 3 to 6 with $x=f/f_{zero}$.

When such normalizations are performed, Expressions 3 to 6 transform into the Expressions below.

$$Y_{sin}(x) = I_0(0.765\pi \cdot x) \cdot \exp\left(\frac{0.765^2 \pi^2}{4} \cdot x^2\right) \quad \text{Expression 3'}$$

$$Y_{Tra}(x, \alpha) = \text{sinc}(x) \cdot \text{sinc}\left(\frac{1-\alpha}{1+\alpha} \cdot x^2\right) \cdot \exp\left(\frac{\pi^2(1+\alpha^2)}{3(1+\alpha)^2} \cdot x^2\right) \quad \text{Expression 4'}$$

$$Y_{DD}(x) = \cos\left(\frac{\pi}{2} \cdot x\right) \cdot \exp\left(\frac{\pi^2}{8} \cdot x^2\right) \quad \text{Expression 5'}$$

$$Y_{Dirac}(x) = 1 \quad \text{Expression 6'}$$

The theoretical value calculating section 140 may be provided in advance with Expressions 3' to 6'. In this case, the theoretical value calculating section 140 may calculate the theoretical values of the spectrums of the various types of deterministic components by substituting the first null frequency detected by the null frequency detecting section 130 into Expressions 3' to 6'.

The measured value calculating section 150 calculates measured values of the deterministic component spectrum in the probability density function PDF, based on the standard deviation $\sigma_{TJ,RMS}$ calculated by the standard deviation calculating section 110 and the spectrum calculated by the spectrum calculating section 120. The measured value calculating section 150 may use the spectrum H(x) obtained by normalizing the frequency of the spectrum H(f) calculated by the spectrum calculating section 120 with the first null frequency $f_{zero}$.

The measured value calculating section 150 may calculate the measured values of the deterministic component spectrum by dividing the spectrum H(x) by a Gaussian distribution spectrum having the standard deviation $\sigma_{TJ,RMS}$. In this case, the measured values of the deterministic component spectrum Y(x), shown below, can be obtained from Expression 7.

$$Y(x) = H(x)/\exp(-2\pi^{2}f_{zero}^{2}x^{2}\sigma_{TJ,RMS}^{2}) \quad \text{Expression 8:}$$

Figure 8:
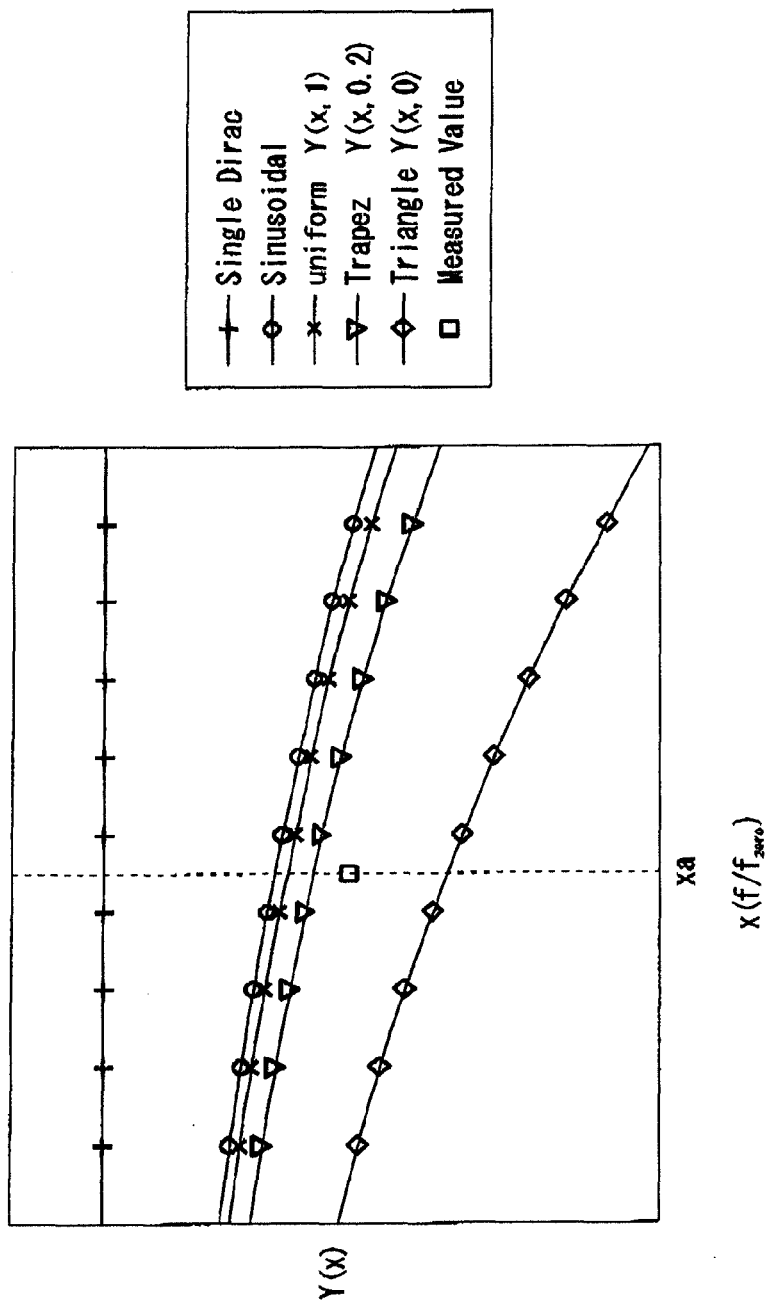
FIG. 8 shows examples of theoretical values of various types of deterministic component spectrums Y(x) calculated by the theoretical value calculating section 140 and a measured value of the deterministic component spectrum Y(x) calculated by the measured value calculating section 150.

FIG. 8 shows examples of theoretical values of various types of deterministic component spectrums Y(x) calculated by the theoretical value calculating section 140 and a measured value of the deterministic component spectrum Y(x) calculated by the measured value calculating section 150. As shown in FIG. 8, the following relationship is seen within a range of 0<x<1.

$$Y_{Dirac}(x) > Y_{DD}(x) > Y_{sin}(x) > Y_{Tra}(x,\alpha)$$

The larger the value of $\alpha$, which is the ratio of the top portion to the bottom portion the trapezoidal distribution, the larger the value of $Y_{Tra}(x,\alpha)$, as shown in the Expression below.

$$Y_{Tra}(x,1) > Y_{Tra}(x,0.5) > Y_{Tra}(x,0.2) > Y_{Tra}(x,0)$$

The model determining section 160 determines the type of deterministic component included in the probability density function to be the type corresponding to the theoretical values closest to the measured values calculated by the measured value calculating section 150, from among the theoretical values calculated by the theoretical value calculating section 140 for each type of deterministic component. The theoretical value calculating section 140 and the measured value calculating section 150 may calculate value of the spectrum at the same predetermined frequency, e.g. the frequency $f/f_{zero}$=xa in FIG. 8, as the theoretical value and the measured value.

In other words, the theoretical value calculating section 140 and the measured value calculating section 150 need not calculate the theoretical values and the measured values of the spectrum across all of the regions. It is, however, desirable that the theoretical value calculating section 140 and the measured value calculating section 150 calculate the value of the spectrum within a frequency range between 0 and the first null frequency. In other words, it is desirable that the theoretical value calculating section 140 and the measured value calculating section 150 calculate the value of the spectrum in a range of 0<xa<1.

In the example of FIG. 8, the measured value is nearest the theoretical value of the trapezoidal distribution ($\alpha$=0.2), and therefore the model determining section 160 may determine that the type of deterministic component included in the probability density function is a trapezoidal distribution. If the model determining section 160 determines that the measured value calculated by the measured value calculating section 150 is between the theoretical value of the uniform distribution and the theoretical value of the triangular distribution, a new trapezoid ratio $\alpha$ may be calculated to bring the theoretical value closer to the measured value. The model determining section 160 may determine the deterministic component model to be the trapezoidal distribution having the calculated trapezoid ratio $\alpha$.

As a result of the above process, the model determining section 160 can accurately determine the model of the deterministic component included in the probability density function. Therefore, the random component and the deterministic component in the probability density function can be accurately calculated.

FIGS. 9A-9D show an exemplary operation of the null frequency detecting section 130. The null frequency detecting section 130 of the present embodiment detects the first null frequency of the spectrum based on the peak of a waveform obtained by performing a second-order differentiation with respect to frequency on the spectrum calculated by the spectrum calculating section 120.

In the present embodiment, f1 represents the first null frequency of the spectrum. If the provided probability density function includes a small amount of noise, the first null frequency of the spectrum can be accurately detected. If, however, the provided probability density function includes a substantial amount of noise, as shown by the spectrum g(f) in Fig. 9A, the first null frequency cannot be detected at the frequency f1 as intended.

Figure 9A:
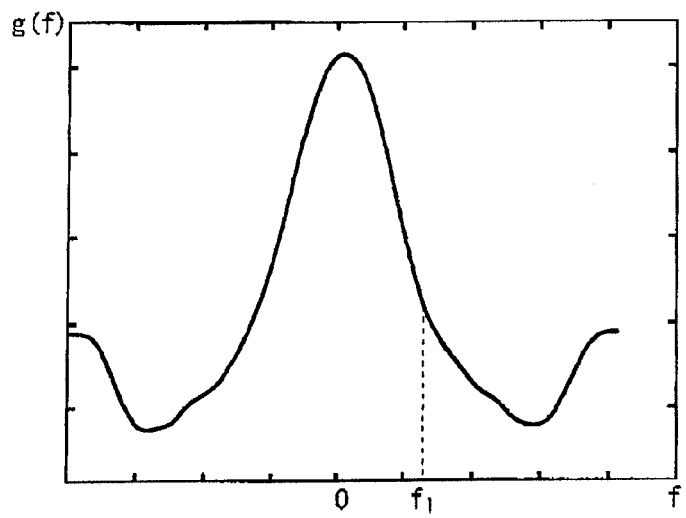
FIGS. 9A-9D show an exemplary operation of the null frequency detecting section 130.
Figure 9B:
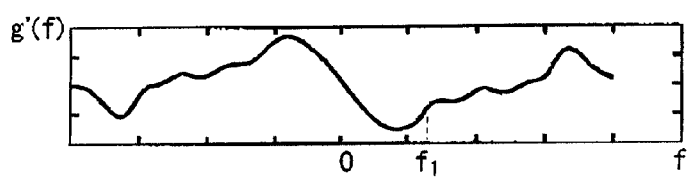
Figure 9C:
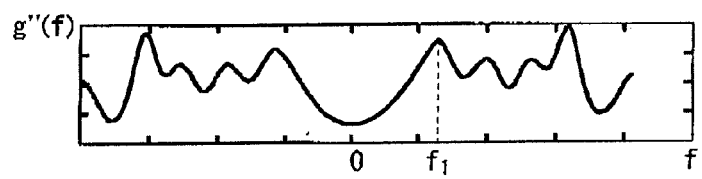
Figure 9D:
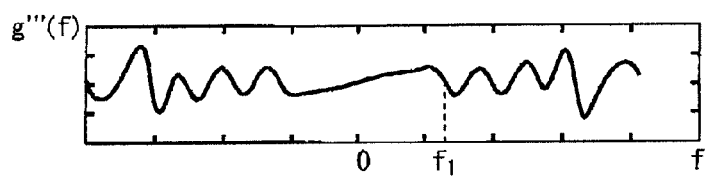

In this case, the first null frequency can be accurately detected by differentiating the spectrum with respect to frequency, as shown in FIGS. 9B-9D. The peak of the second-order differentiated waveform g"(f) of the spectrum, shown in FIG. 9C, corresponds to the null frequency of the spectrum g(f). Therefore, the null frequency detecting section 130 may perform a second-order derivation on the spectrum of the probability density function and detect the first null frequency based on the peak frequency of the derivative spectrum.

Figure 10:
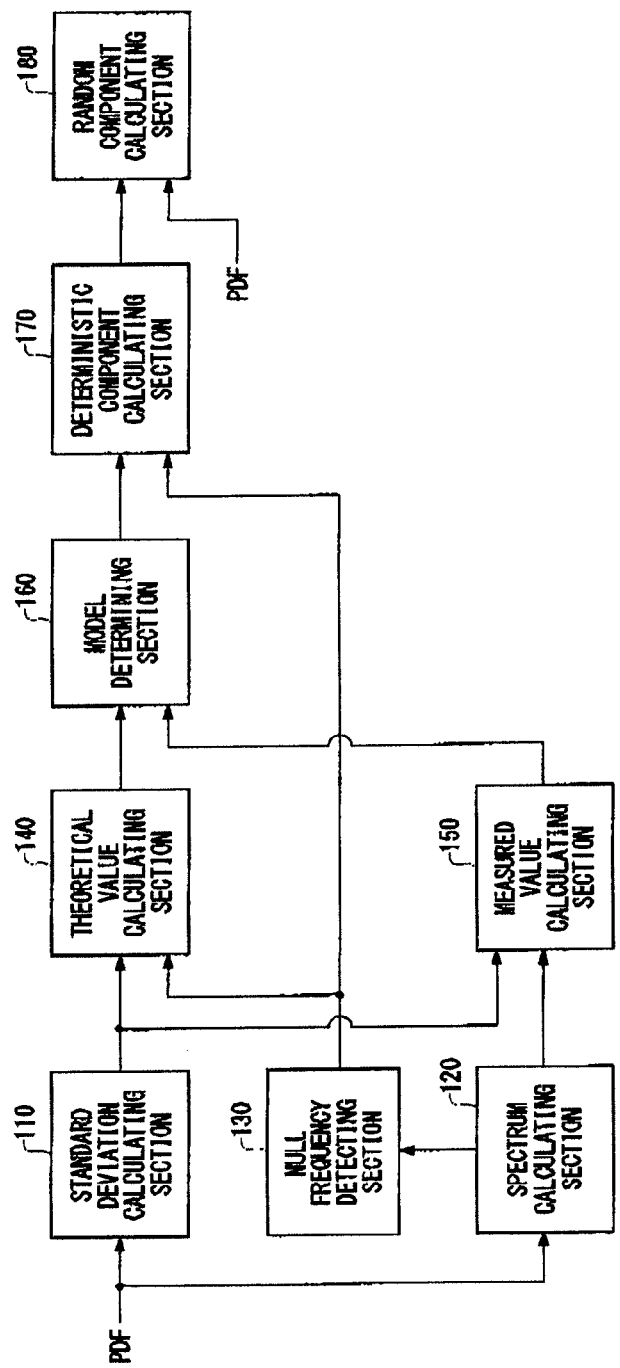
FIG. 10 shows another exemplary configuration of the deterministic component identifying apparatus 100.

FIG. 10 shows another exemplary configuration of the deterministic component identifying apparatus 100. The deterministic component identifying apparatus 100 of the present embodiment is further provided with a deterministic component calculating section 170 and a random component calculating section 180 in addition to the configuration of the deterministic component identifying apparatus 100 described in relation to FIG. 1. Other elements may be the same as the elements described in relation to FIG. 1.

The deterministic component calculating section 170 calculates the deterministic component included in the probability density function based on the type of the deterministic component determined by the model determining section 160 and the first null frequency detected by the null frequency detecting section 130. As shown in FIG. 7, the probability density function of the deterministic component in the frequency domain or the time domain can be determined from the type of the deterministic component and the peak-to-peak value $DJ_{P-P}$.

The deterministic component calculating section 170 may calculate the probability density function of the deterministic component by calculating the peak-to-peak value $DJ_{P-P}$ from the first null frequency. The deterministic component calculating section 170 may be provided with a table showing, for each type of deterministic component, a time-domain model, a frequency-domain model, a relation between the first null frequency $f_{zero}$ and the peak-to-peak value $DJ_{P-P}$, and the relationship between the peak-to-peak value $DJ_{P-P}$ and a root mean squared value $DJ_{RMS}$, as shown in FIG. 7.

The random component calculating section 180 calculates the random component included in the probability density function PDF by eliminating the deterministic component calculated by the deterministic component calculating section 170 from the probability density function PDF provided to the deterministic component identifying apparatus 100. For example, the random component calculating section 180 may calculate the random component in the time domain by deconvoluting the deterministic component in the time domain from the probability density function PDF in the time domain. The random component calculating section 180 may calculate the random component in the frequency domain by eliminating the deterministic component in the time domain from the probability density function PDF in the time domain. The random component calculating section 180 may further calculate the standard deviation of the calculated random component.

Using the configuration above enables the random component and the deterministic component in the probability density function to be accurately separated from each other. Therefore, when measuring jitter, for example, the target can be accurately evaluated because the random jitter and the deterministic jitter are accurately separated from each other.

Figure 11:
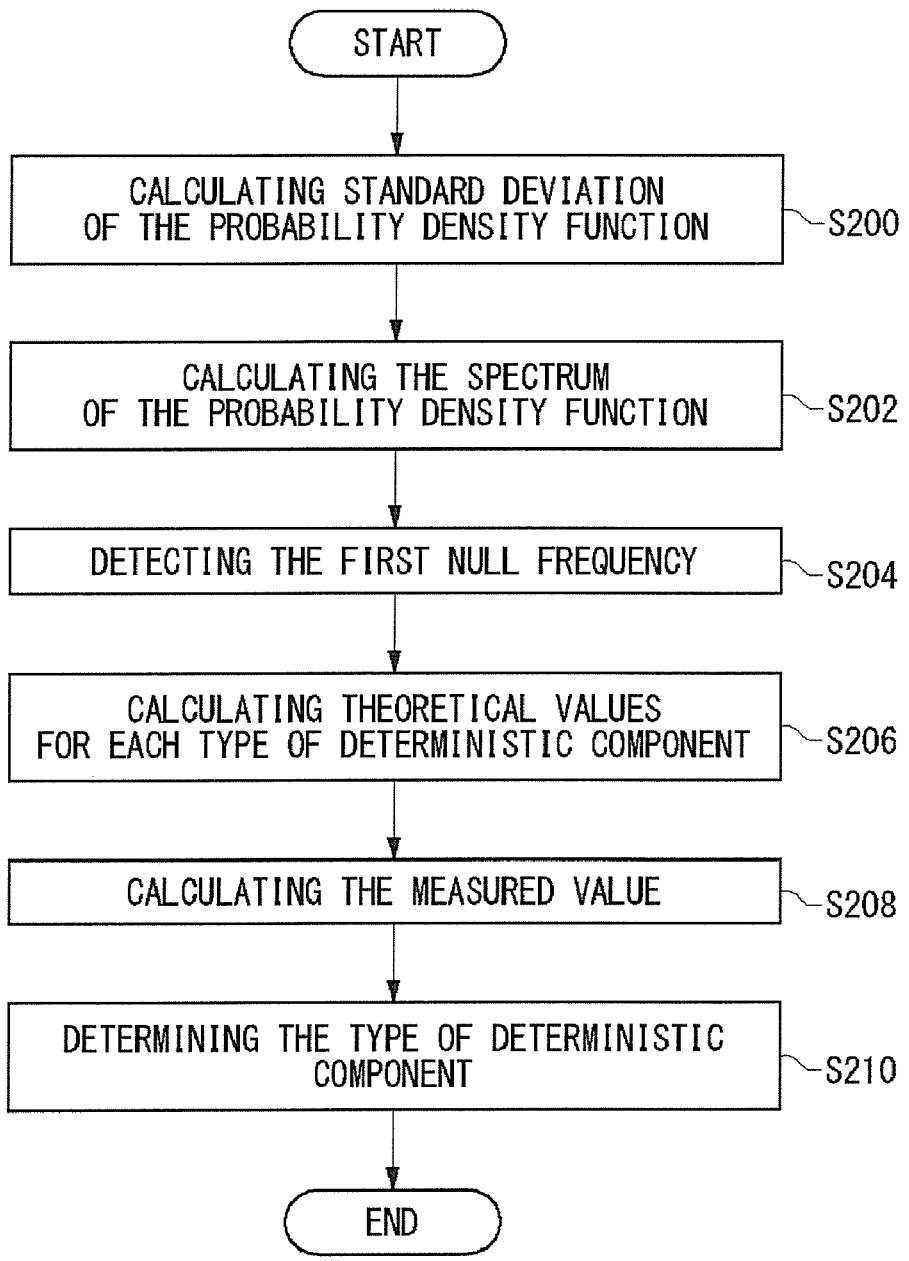
FIG. 11 is a flow chart showing the operation performed by the deterministic component identifying apparatus 100.

FIG. 11 is a flow chart showing the processes performed by the deterministic component identifying apparatus 100 for determining the model of the deterministic component. First, the standard deviation calculating section 110 calculates the standard deviation of the probability density function (S200). The spectrum calculating section 120 then calculates the spectrum of the probability density function (S202). Next, the null frequency detecting section 130 calculates the first null frequency of the spectrum calculated by the spectrum calculating section 120 (S204). The processes of S202 and S204 may be performed in parallel with the process of S200.

The theoretical value calculating section 140 calculates the theoretical values of each type of deterministic component based on the first null frequency detected by the null frequency detecting section 130 (S206). The measured value calculating section 150 then calculates the measured value of the deterministic component based on the standard deviation calculated by the standard deviation calculating section 110 and the spectrum calculated by the spectrum calculating section 120 (S208). The process of S208 may be performed in parallel with the process of S206.

The model determining section 160 compares each theoretical value calculated by the theoretical value calculating section 140 to the measured value calculated by the measured value calculating section 150 to determine the type of deterministic component included in the probability density function (S210). The processes described above enable the deterministic component identifying apparatus 100 to accurately determine the type of deterministic component.

Figure 12:
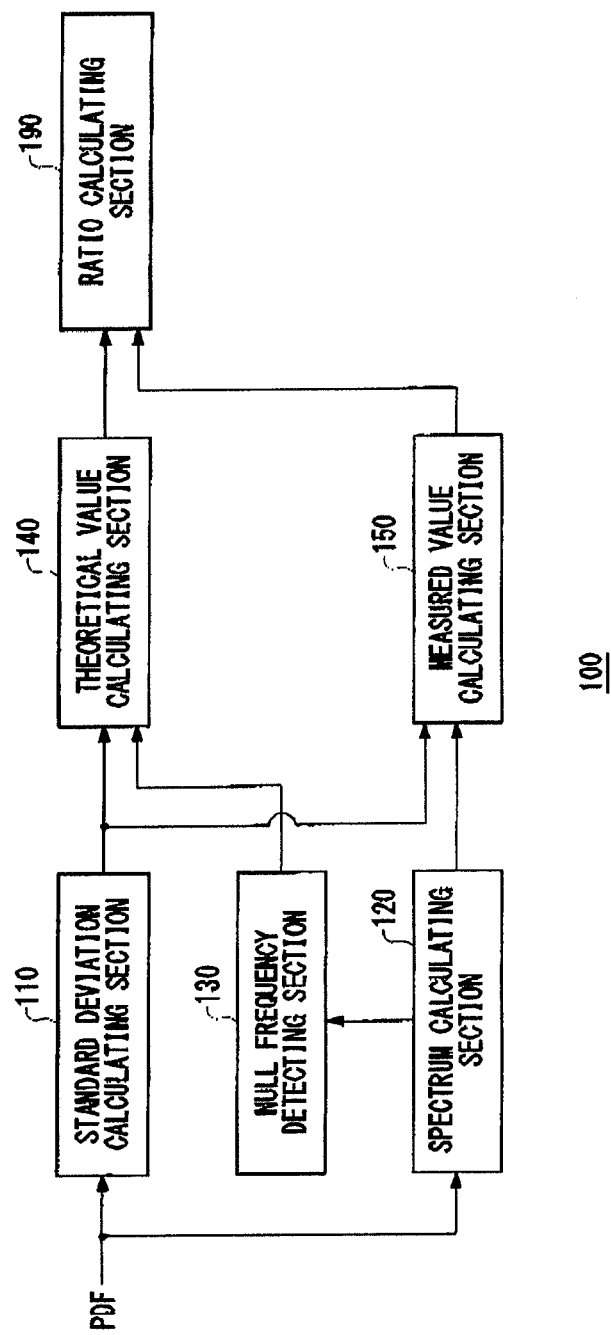
FIG. 12 shows another exemplary configuration of the deterministic component identifying apparatus 100.

FIG. 12 shows another exemplary configuration of the deterministic component identifying apparatus 100. The deterministic component identifying apparatus 100 of the present embodiment calculates the trapezoid ratio $\alpha$ of a deterministic component following a trapezoidal distribution. The deterministic component identifying apparatus 100 of the present embodiment has the same configuration as the deterministic component identifying apparatus 100 described in relation to FIG. 1, except that the model determining section 160 is replaced by a ratio calculating section 190. The standard deviation calculating section 110, the spectrum calculating section 120, the null frequency detecting section 130, the theoretical value calculating section 140, and the measured value calculating section 150 may have the same function and configuration as the elements having the same reference numerals in FIGS. 1 to 11.

The ratio calculating section 190 calculates the trapezoid ratio $\alpha$ based on the standard deviation of the probability density function calculated by the standard deviation calculating section 110, the spectrum of the probability density function calculated by the spectrum calculating section 120, and the null frequency detected by the null frequency detecting section 130. As shown in Expressions 4 and 4', the spectrum of the probability density function obtained when the deterministic component included in the probability density function follows a trapezoidal distribution is determined according to the first null frequency $f_{zero}$, the standard deviation $\sigma_{TJ,RMS}$ of the probability density function, and the trapezoid ratio $\alpha$. Therefore, the trapezoid ratio can be calculated from the spectrum of the probability density function, the first null frequency $f_{zero}$, and the standard deviation $\sigma_{TJ,RMS}$ of the probability density function.

The measured value calculating section 150 calculates the measured value of the spectrum for the deterministic component included in the probability density function based on the standard deviation $\sigma_{TJ,RMS}$ calculated by the standard deviation calculating section 110 and the spectrum H(x) calculated by the spectrum calculating section 120. For example, the measured value calculating section 150 calculates the measured value of the spectrum using Expression 8. The measured value calculating section 150 may instead calculate the measured value Y(x1) of the spectrum at a preset frequency x1, where $x1=f1/f_{zero}$.

The ratio calculating section 190 calculates the trapezoid ratio $\alpha$ such that the theoretical value of the spectrum of the deterministic component determined by the trapezoid ratio $\alpha$ and the first null frequency $f_{zero}$ is near the measured value of the spectrum. For example, the ratio calculating section 190 is provided with the theoretical values of the deterministic component spectrums corresponding to several different preset trapezoid ratios $\alpha$, and selects the trapezoid ratio $\alpha$ that corresponds to the theoretical value closest to the measured value calculated by the measured value calculating section 150.

The theoretical value calculating section 140 may calculate the theoretical value of each deterministic component spectrum corresponding to the several trapezoid ratios $\alpha$. At this time, the theoretical value calculating section 140 may calculate the theoretical value at the preset frequency x1. The theoretical value calculating section 140 may calculate the theoretical value for each trapezoid ratio $\alpha$ using Expression 4'.

The theoretical value calculating section 140 notifies the ratio calculating section 190 about the theoretical values corresponding to the several trapezoid ratios α. As described above, the ratio calculating section 190 may compare these theoretical values to the measured value calculated by the measured value calculating section 150 and select the trapezoid ratio α that corresponds to the theoretical value closest to the measured value. The ratio calculating section 190 may calculate a trapezoid ratio that corresponds to a theoretical value substantially equal to the measured value by interpolating a theoretical value between the trapezoid ratios α used by the theoretical value calculating section 140. At this time, the ratio calculating section 190 may use widely known interpolation techniques such as linear interpolation or spline interpolation.

Another method for determining the trapezoid ratio α involves the ratio calculating section 190 generating an expression for obtaining the trapezoid ratio α, based on the plurality of theoretical values corresponding to the trapezoid ratios α supplied from the theoretical value calculating section 140, with the measured value H(x1) of the deterministic component spectrum at the prescribed frequency x1 as a variable. For example, the ratio calculating section 190 may receive a combination of N groups of trapezoid ratios α and theoretical values $H_{ideal}(x1)$ from the theoretical value calculating section 140.

The ratio calculating section 190 may then generate an expression that approximates α with an N−1 order polynomial of the theoretical values $H_{ideal}(x1)$. Here, when the theoretical value $H_{ideal}(x1)=m$, the N−1 order approximation expression can be obtained from Expression 9 below. Note that $k_i$ represents an i-th order coefficient.

$$\alpha = \sum_{i=0}^{N-1} k_i x^i \quad \text{Expression 9}$$

The ratio calculating section 190 may calculate the trapezoid ratio α by substituting the measured value H(x) of the deterministic component spectrum calculated by the measured value calculating section 150 for x in Expression 9. This technique as well can be used to determine the trapezoid ratio α.

Yet another method for determining the trapezoid ratio α involves the ratio calculating section 190 using a sounding technique such as bisection to detect a trapezoid ratio α that causes the difference between (i) the theoretical value obtained when a prescribed trapezoid ratio α is substituted into Expression 4 and (ii) the measured value calculated by the measured value calculating section 150 to fall within a prescribed acceptable range. This technique as well can be used to determine the trapezoid ratio α.

Figure 13:
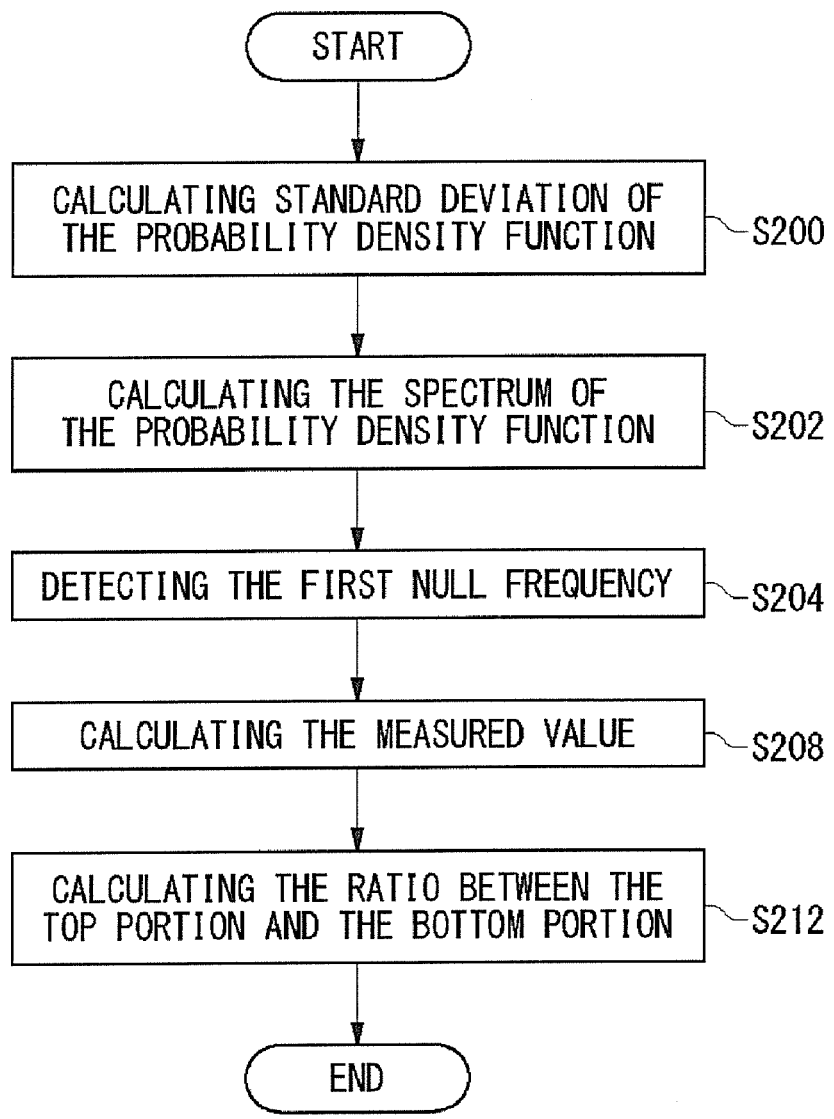
FIG. 13 is a flow chart showing an exemplary operation of the deterministic component identifying apparatus 100 described in relation to FIG. 12.

FIG. 13 is a flow chart showing an exemplary operation of the deterministic component identifying apparatus 100 described in relation to FIG. 12. In the present embodiment, the processes from S200 to S208 may be the same as the processes from S200 to S208 described in relation to FIG. 11. After the process of S208, the ratio calculating section 190 calculates the trapezoid ratio α, which is the ratio between the top portion and the bottom portion in the distribution of the deterministic component (S212). As a result of the processes described above, the trapezoid ratio of the deterministic component following a trapezoidal distribution included in the probability density function can be calculated.

Figure 14:
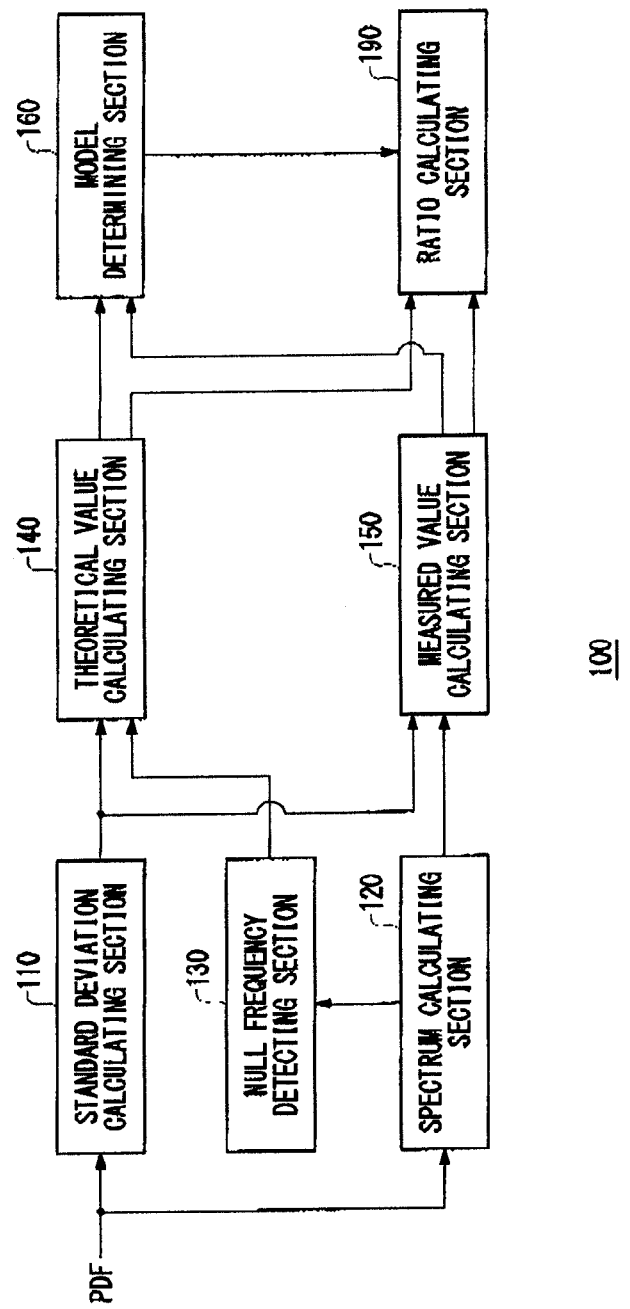
FIG. 14 shows another exemplary configuration of the deterministic component identifying apparatus 100.

FIG. 14 shows another exemplary configuration of the deterministic component identifying apparatus 100. The deterministic component identifying apparatus 100 of the present embodiment is further provided with the ratio calculating section 190 in addition to the configuration of the deterministic component identifying apparatus 100 described in relation to FIG. 1. The ratio calculating section 190 may be the same as the ratio calculating section 190 described in relation to FIG. 12.

The deterministic component identifying apparatus 100 of the present embodiment uses the model determining section 160 to determine whether the deterministic component included in the probability density function follows a trapezoidal distribution. The model determining section 160 may determine whether the model of the deterministic component included in the probability density function is a sinusoidal distribution, a uniform distribution, a dual Dirac distribution, a trapezoidal distribution, or the like. If the model determining section 160 determines that the deterministic component included in the probability density function follows a trapezoidal distribution, the ratio calculating section 190 calculates the trapezoid ratio α of the deterministic component.

In the example described in FIG. 8, the deterministic component model is determined to be a trapezoidal distribution if the measured value is near the theoretical value of a trapezoidal distribution with a trapezoidal ratio of α=0.2. However, the trapezoid ratio α of a trapezoidal distribution can be any value between 0 and 1. Therefore, if the measured value calculated by the measured value calculating section 150 is between the theoretical value of a triangular distribution, which has a trapezoid ratio of α=0, and the theoretical value of a uniform distribution, which has a trapezoid ratio of α=1, the model determining section 160 determines that the model of the deterministic component is a trapezoidal distribution.

As another example, the model determining section 160 determines the deterministic component model to be a trapezoidal distribution if the measured value is near the theoretical value of a trapezoidal distribution having a prescribed trapezoid ratio, such as α=0.5. As a result of the above processes, the model of the deterministic component included in the probability density function can be determined and, if the deterministic component model is a trapezoidal distribution, the trapezoid ratio α of the trapezoidal distribution can be calculated. Therefore, the shape of the distribution of the deterministic component can be accurately identified.

The deterministic component identifying apparatus 100 of the present embodiment may also be provided with the deterministic component calculating section 170 and the random component calculating section 180 described in relation to FIG. 10. In this case, the deterministic component calculating section 170 may further receive the trapezoid ratio α calculated by the ratio calculating section 190. The deterministic component calculating section 170 may use the expressions described in relation to FIG. 7 to calculate the deterministic component based on the type of the deterministic component, the first null frequency $f_{zero}$, and the trapezoidal distribution α.

Figure 15:
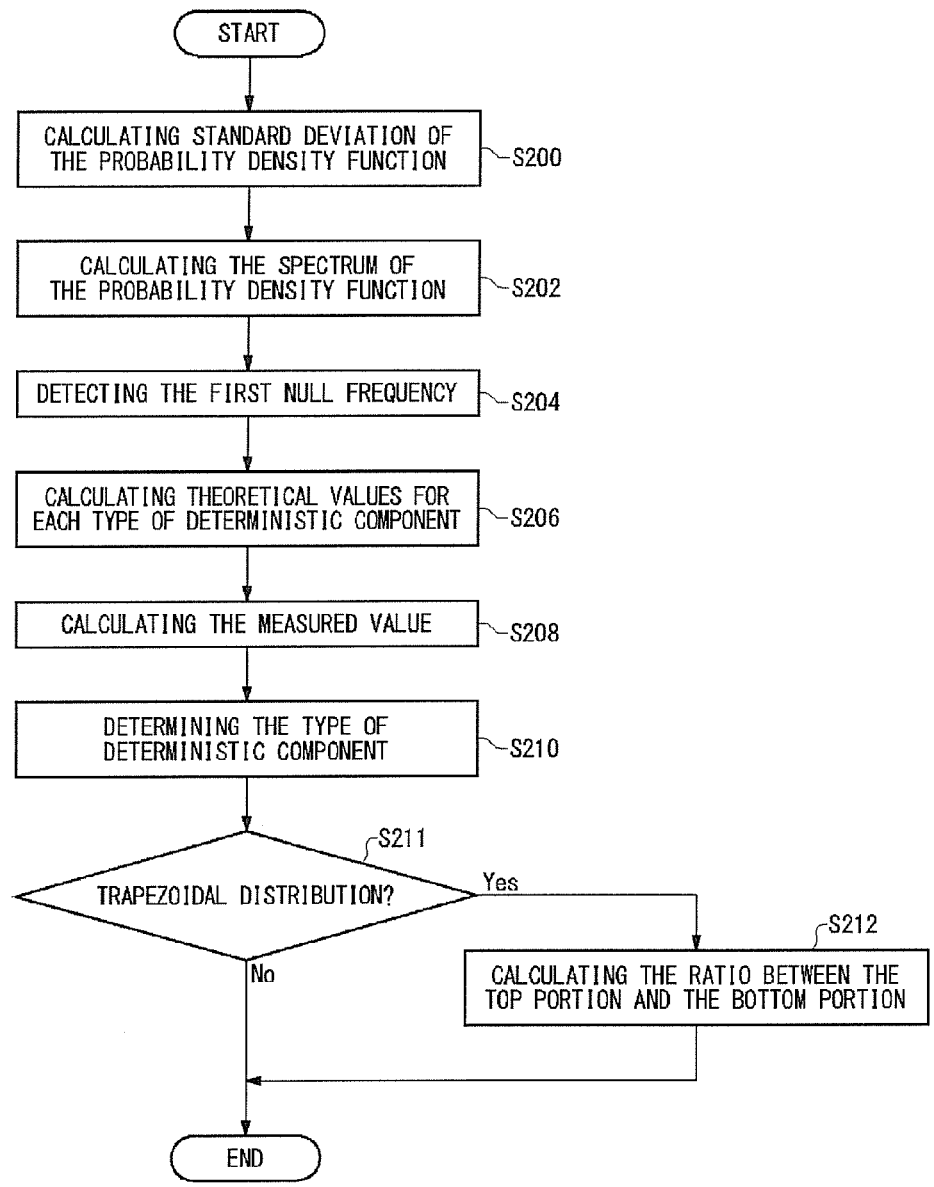
FIG. 15 is a flow chart showing an exemplary operation of the deterministic component identifying apparatus 100 shown in FIG. 14.

FIG. 15 is a flow chart showing an exemplary operation of the deterministic component identifying apparatus 100 shown in FIG. 14. In the present embodiment, the processes from S200 to S210 may be the same as the processes from S200 to S210 described in relation to FIG. 11. After the process of S210, the model determining section 160 determines whether the deterministic component model is a trapezoidal distribution (S211). If the deterministic component model is a trapezoidal distribution, the model determining section 160 informs the ratio calculating section 190 of this fact. If the deterministic component model is not a trapezoidal distribution, the deterministic component identifying apparatus 100 may end the series of processes.

Upon receiving the notification from the model determining section 160, the ratio calculating section 190 calculates the trapezoid ratio α (S212). At this time, the theoretical value calculating section 140 may calculate each theoretical value described in relation to FIG. 12 and supply these theoretical values to the ratio calculating section 190. The ratio calculating section 190 calculates the trapezoid ratio α by comparing the measured value calculated by the measured value calculating section 150 to the theoretical values calculated by the theoretical value calculating section 140. As a result of the processes described above, the model of the deterministic component included in the probability density function can be determined and, if the deterministic component model is a trapezoidal distribution, the trapezoid ratio α of the trapezoidal distribution can be calculated.

Figure 16:
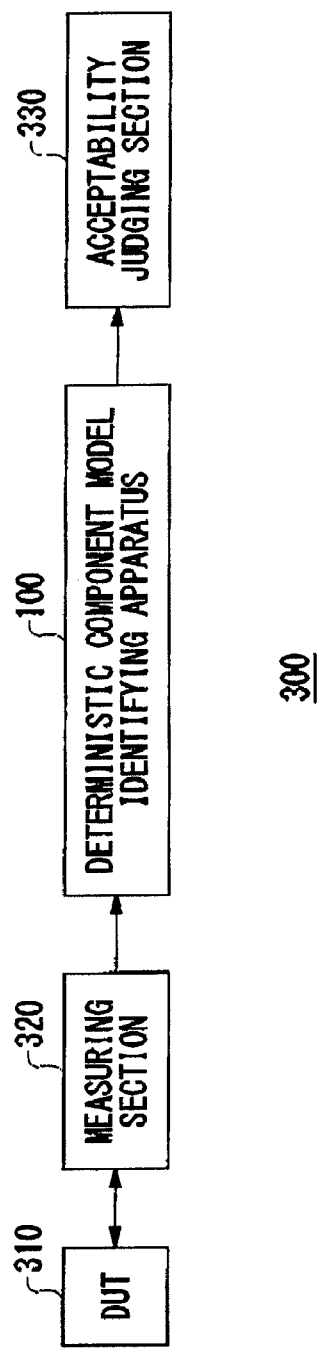
FIG. 16 shows an exemplary configuration of a test system 300 according to an embodiment of the present invention.

FIG. 16 shows an exemplary configuration of a test system 300 according to an embodiment of the present invention. The test system 300 tests a device under test such as a semiconductor circuit or a communication device. The test system 300 includes a measuring section 320, the deterministic component identifying apparatus 100, and an acceptability judging section 330.

The measuring section 320 measures a prescribed characteristic of the device under test 310 a plurality of times to generate a probability density function of the measured values of the characteristic. For example, the measuring section 320 measures the jitter, voltage, current, or the like of a signal output by the device under test 310.

The deterministic component identifying apparatus 100 determines the type of deterministic component included in the probability density function of the characteristic values measured by the measuring section 320. The deterministic component identifying apparatus 100 calculates at least one of the deterministic component and the random component included in the probability density function. The deterministic component identifying apparatus 100 may be the same as the deterministic component identifying apparatus 100 described in relation to FIG. 10.

The acceptability judging section 330 judges acceptability of the device under test 310 based on the deterministic component or the random component calculated by the deterministic component identifying apparatus 100. For example, the acceptability judging section 330 may judge whether the deterministic component or the random component calculated by the deterministic component identifying apparatus 100 fulfills a prescribed condition. The configuration described above enables the test system 300 to accurately judge the acceptability of the device under test 310.

Figure 17:
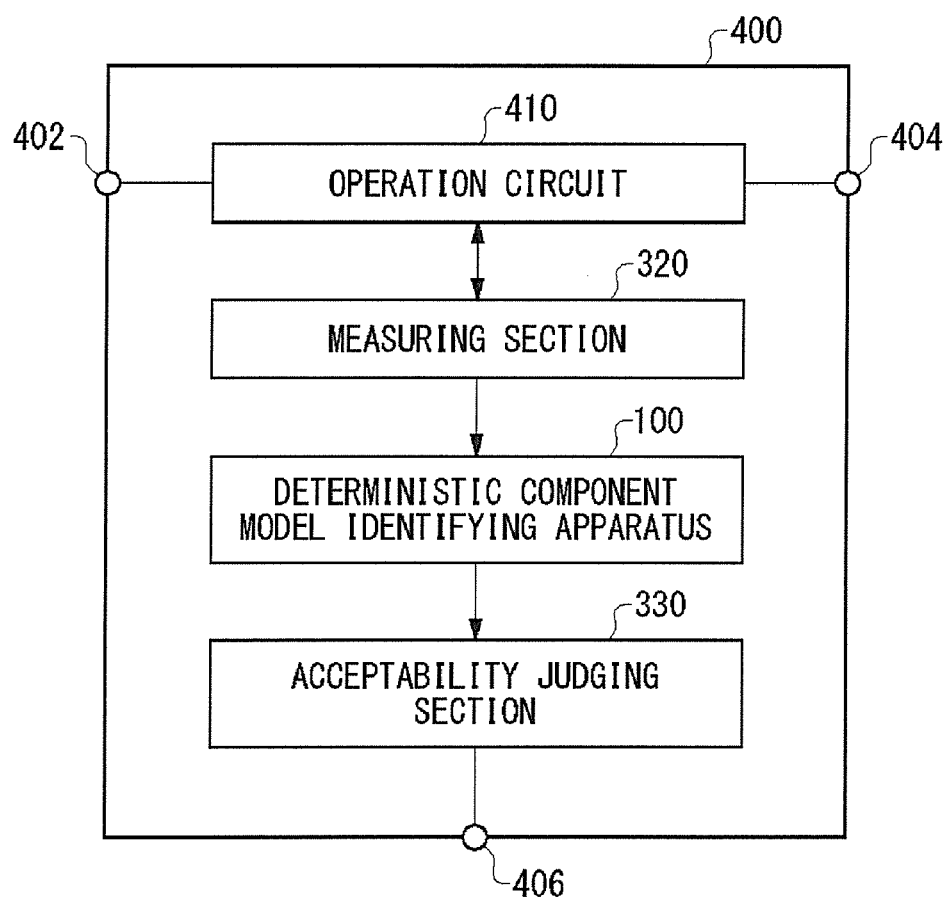
FIG. 17 shows an exemplary configuration of an electronic device 400 according to an embodiment of the present invention.

FIG. 17 shows an exemplary configuration of an electronic device 400 according to an embodiment of the present invention. The electronic device 400 of the present embodiment operates according to a signal supplied form an input pin 402 to output a prescribed generated signal from an output pin 404. The electronic device 400 includes an operation circuit 410, the measuring section 320, the deterministic component identifying apparatus 100, and the acceptability judging section 330.

The operation circuit 410 operates according to a signal supplied thereto. The operation circuit 410 may generate a prescribed signal according to a result of the operation. The measuring section 320, the deterministic component identifying apparatus 100, and the acceptability judging section 330 may function as a BIST circuit that tests whether the operation circuit 410 is operating properly.

The measuring section 320 performs a plurality of measurements of a prescribed characteristic of a prescribed signal generated by the operation circuit 410, to generate a probability density function. The deterministic component identifying apparatus 100 calculates the deterministic component and the random component included in the probability density function generated by the measuring section 320. The acceptability judging section 330 judges the acceptability of the operation circuit 410 based on the deterministic component and the random component calculated by the deterministic component identifying apparatus 100. The measuring section 320, the deterministic component identifying apparatus 100, and the acceptability judging section 330 may be the same as the measuring section 320, the deterministic component identifying apparatus 100, and the acceptability judging section 330 described in relation to FIG. 16.

The acceptability judging section 330 may instead output the acceptability judgment result to the outside via a test pin 406. The configuration described above provides an electronic device 400 that can accurately evaluate an internal operation circuit 410.

Figure 18:
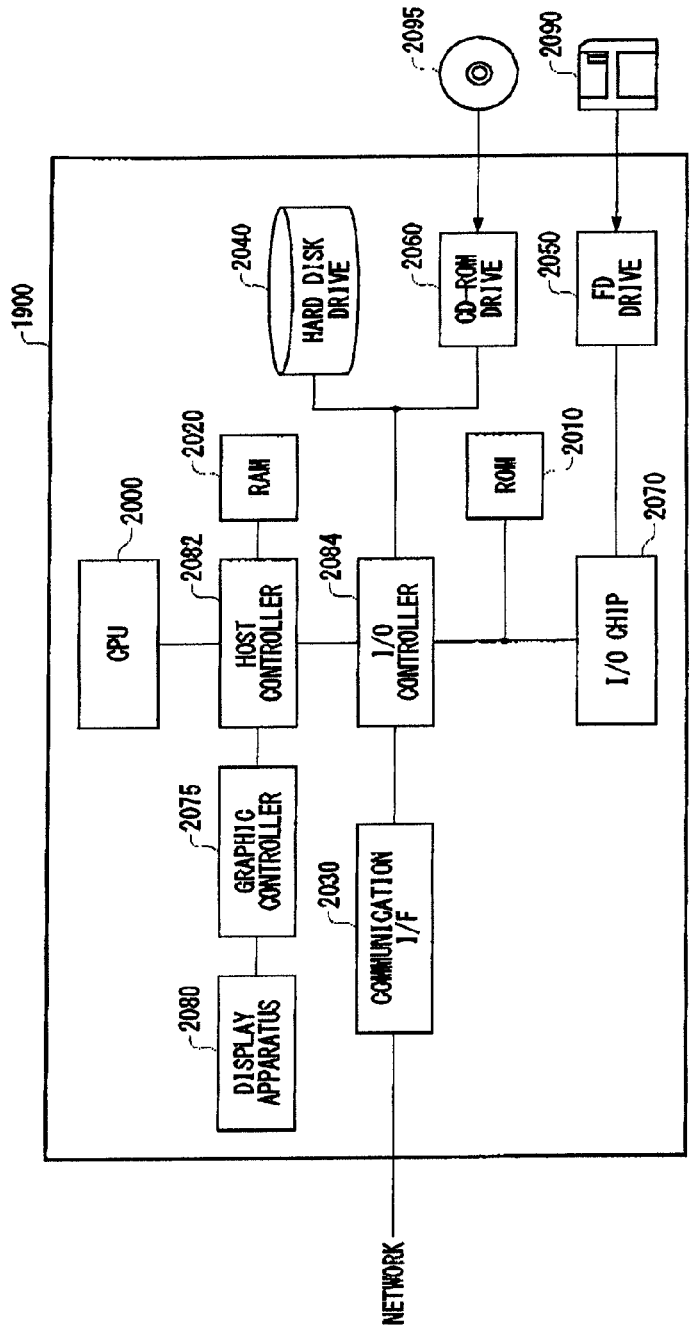
FIG. 18 shows an example of a hardware configuration of a computer 1900 according to an embodiment of the present invention.

FIG. 18 shows an example of a hardware configuration of a computer 1900 according to an embodiment of the present invention. The computer 1900 functions as the deterministic component identifying apparatus 100 described in relation to FIGS. 1 to 15, based on a program provided thereto. The program may cause the computer 1900 to function as each element of the deterministic component identifying apparatus 100 described in relation to FIGS. 1 to 15.

The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000. These programs are installed in the computer 1900. These programs prompt the CPU 2000 or the like to make the computer 1900 function as the deterministic component identifying apparatus 100.

The programs shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a deterministic component identifying apparatus that can accurately determine the type of deterministic component included in the probability density function.

What is claimed is:

1. A test system comprising:
a deterministic component identifying apparatus that identifies a distribution shape of a deterministic component included in a probability density function supplied thereto, comprising:
a standard deviation calculating section that calculates a standard deviation of the probability density function;
a spectrum calculating section that calculates a spectrum of the probability density function;
a null frequency detecting section that detects a null frequency of the spectrum; and
a ratio calculating section for calculating a ratio between a top portion and a bottom portion of the distribution shape of the deterministic component, based on the standard deviation of the probability density function and the null frequency of the spectrum;
wherein the test system tests a device under test based on the distribution shape of the deterministic component identified by the deterministic component identifying apparatus.

2. The test system according to claim 1, further comprising a measured value calculating section that calculates a measured value of the spectrum for the deterministic component included in the probability density function, based on the standard deviation calculated by the standard deviation calculating section and the spectrum calculated by the spectrum calculating section, wherein
the ratio calculating section calculates the ratio between the top portion and the bottom portion such that a theoretical value of the spectrum of the deterministic component, which is designated by the null frequency detected by the null frequency detecting section and the ratio between the top portion and the bottom portion in the distribution of the deterministic component, is near the measured value of the spectrum.

3. The test system according to claim 2, wherein
the measured value calculating section calculates, as the measured value of the spectrum of the deterministic component, a value of the spectrum of the deterministic component at a preset frequency, and
the ratio calculating section calculates the ratio between the top portion and the bottom portion such that the theoretical value of the spectrum of the deterministic component at the preset frequency is near the measured value of the spectrum of the deterministic component.

4. The test system according to claim 3, further comprising a theoretical value calculating section that calculates a theoretical value of a spectrum of a deterministic component for each of a plurality of preset ratios between the top portion and the bottom portion, and
the ratio calculating section calculates the ratio between the top portion and the bottom portion by comparing the theoretical value of the spectrum of each of the plurality of deterministic components to the measured value.

5. The test system according to claim 3, further comprising a theoretical value calculating section that calculates a theoretical value, at a preset frequency, of a spectrum of a deterministic component for each of a plurality of preset ratios between the top portion and the bottom portion, and
the ratio calculating section calculates the ratio between the top portion and the bottom portion by (i) generating an expression for obtaining the ratio between the top portion and the bottom portion, with the measured value of the spectrum of the deterministic component at the preset frequency as a variable, based on the plurality of theoretical values and the plurality of preset ratios between the top portion and the bottom portion and (ii) substituting the measured value of the spectrum of the deterministic component calculated by the measured value calculating section into the generated expression.

6. The test system according to claim 2, further comprising a model determining section that determines whether the deterministic component included in the probability density function follows a trapezoidal distribution, wherein
the ratio calculating section calculates the ratio between the top portion and the bottom portion if the model determining section determines that the deterministic component included in the probability density function follows a trapezoidal distribution.

7. The test system according to claim 6, wherein
the model determining section determines whether the deterministic component included in the probability density function follows a trapezoidal distribution based on the standard deviation calculated by the standard deviation calculating section, the spectrum calculated by the spectrum calculating section, and the null frequency detected by the null frequency detecting section.

8. The test system according to claim 7, further comprising a theoretical value calculating section that calculates a theoretical value of a spectrum for each of a plurality of deterministic components having various types of preset distributions including a trapezoidal distribution, based on the null frequency detected by the null frequency detecting section, wherein
the model determining section determines the type of the deterministic component included in the probability density function to be the type of deterministic component corresponding to the theoretical value that is closest to the measured value calculated by the measured value calculating section, from among the theoretical values calculated respectively for the various types of deterministic components by the theoretical value calculating section.

9. The test system according to claim 8, wherein
the theoretical value calculating section calculates a theoretical value of a spectrum for each of a plurality of deterministic components following various types of distributions including a triangular distribution and a uniform distribution, and
the model determining section determines that the deterministic component included in the probability density function follows a trapezoidal distribution if the measured value calculated by the measured value calculating section is between a theoretical value of the deterministic component following the triangular distribution and a theoretical value of the deterministic component following the uniform distribution.

10. The test system according to claim 1, wherein
the null frequency detecting section detects the null frequency that is first in the spectrum.

11. A method for identifying a distribution shape of a deterministic component included in a supplied probability density function of a characteristic value of an electric signal, the method performed by one or more computer processors and comprising:
calculating a standard deviation of the probability density function;
calculating a spectrum of the probability density function;
detecting a null frequency of the spectrum; and
calculating a ratio between a top portion and a bottom portion of a distribution shape of the deterministic component, based on the standard deviation of the probability density function and the null frequency of the spectrum.

12. A non-transitory recording medium storing thereon a program causing a computer to function as a deterministic component identifying apparatus that identifies a distribution shape of a deterministic component included in a probability density function supplied thereto, the computer being caused to function as:
a standard deviation calculating section that calculates a standard deviation of the probability density function;
a spectrum calculating section that calculates a spectrum of the probability density function;
a null frequency detecting section that detects a null frequency of the spectrum; and
a ratio calculating section for calculating a ratio between a top portion and a bottom portion of the distribution shape of the deterministic component, based on the standard deviation of the probability density function and the null frequency of the spectrum.

13. A test system that tests a device under test, comprising:
a measuring section that measures a prescribed characteristic of the device under test a plurality of times;
a deterministic component identifying apparatus that identifies a distribution shape of a deterministic component included in a probability density function of characteristic values measured by the measuring section, and calculates the deterministic component; and
an acceptability judging section that judges acceptability of the device under test based on the deterministic component calculated by the deterministic component identifying apparatus, wherein the deterministic component identifying apparatus includes:
a standard deviation calculating section that calculates a standard deviation of the probability density function;
a spectrum calculating section that calculates a spectrum of the probability density function;
a null frequency detecting section that detects a null frequency of the spectrum; and
a ratio calculating section for calculating a ratio between a top portion and a bottom portion of the distribution shape of the deterministic component, based on the standard deviation of the probability density function and the null frequency of the spectrum.

14. An electronic device that generates a prescribed signal, comprising:
an operation circuit that generates and outputs the prescribed signal;
a measuring section that measures a prescribed characteristic of the prescribed signal a plurality of times; and
a deterministic component identifying apparatus that identifies a distribution shape of a deterministic component included in a probability density function of characteristic values measured by the measuring section, and calculates the deterministic component, wherein the deterministic component identifying apparatus includes:
a standard deviation calculating section that calculates a standard deviation of the probability density function;
a spectrum calculating section that calculates a spectrum of the probability density function;
a null frequency detecting section that detects a null frequency of the spectrum; and
a ratio calculating section for calculating a ratio between a top portion and a bottom portion of the distribution shape of the deterministic component, based on the standard deviation of the probability density function and the null frequency of the spectrum.

* * * * *